(12) United States Patent
Lin et al.

(10) Patent No.: US 8,247,285 B2
(45) Date of Patent: Aug. 21, 2012

(54) N-FET WITH A HIGHLY DOPED SOURCE/DRAIN AND STRAIN BOOSTER

(75) Inventors: Jing-Cheng Lin, Hsin-Chu (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 207 days.

(21) Appl. No.: 12/341,674

(22) Filed: Dec. 22, 2008

(65) Prior Publication Data
US 2010/0155790 A1 Jun. 24, 2010

(51) Int. Cl.
*H01L 21/8238* (2006.01)
(52) U.S. Cl. .................. 438/216; 438/300
(58) Field of Classification Search ............ 438/299, 438/300, 216
See application file for complete search history.

(56) References Cited

U.S. PATENT DOCUMENTS

| | | | |
|---|---|---|---|
| 6,271,551 B1 | 8/2001 | Schmitz et al. | |
| 6,605,498 B1 | 8/2003 | Murthy et al. | |
| 6,881,635 B1 | 4/2005 | Chidambarrao et al. | |
| 6,977,400 B2 | 12/2005 | Puchner et al. | |
| 7,148,526 B1 | 12/2006 | An et al. | |
| 7,195,985 B2 | 3/2007 | Murthy et al. | |
| 7,221,006 B2 | 5/2007 | Orlowski et al. | |
| 7,244,958 B2 | 7/2007 | Shang et al. | |
| 7,247,535 B2 | 7/2007 | Jain | |
| 7,358,551 B2 | 4/2008 | Chidambarrao et al. | |
| 7,387,925 B2 | 6/2008 | Shang et al. | |
| 2005/0023552 A1* | 2/2005 | Chang et al. .................. 257/103 |
| 2005/0093084 A1* | 5/2005 | Wang et al. .................. 257/410 |
| 2006/0237746 A1 | 10/2006 | Orlowski et al. | |
| 2007/0131969 A1 | 6/2007 | Sanuki et al. | |
| 2007/0148939 A1* | 6/2007 | Chu et al. ...................... 438/590 |
| 2007/0190730 A1 | 8/2007 | Huang et al. | |
| 2007/0235802 A1 | 10/2007 | Chong et al. | |
| 2010/0181626 A1 | 7/2010 | Lin et al. | |

OTHER PUBLICATIONS

Palmer et al., "Effective mobilities in pseudomorphic Si/SiGe/Si p-channel metal-oxide-semiconductor field-effect transistors with thin silicon capping layers," Applied Physics Letters vol. 78, No. 10., Mar. 5, 2001, (pp. 1424-1426).

Wang et al., "Optimized Si-Cap Layer Thickness for Tensile-Strained-Si/Compressively Strained SiGe Dual-Channel Transistors in 0.13 μm Complementary Metal Oxide Semiconductor Technology," Japanese Journal of Applied Physics, vol. 44, No. 40, 2005, (pp. L 1248-L 1251).

Prabhakaran, T. K., et al., "In Situ Oxidation of a Thin Layer of Ge on Si(001): Observation of GeO to SiO2 Transition," American Institute of Physics, Feb. 22, 1993, pp. 864-866, vol. 62, No. 8.

(Continued)

*Primary Examiner* — Jarrett Stark
*Assistant Examiner* — John M Parker
(74) *Attorney, Agent, or Firm* — Slater & Matsil, L.L.P.

(57) ABSTRACT

A structure and method of making an N-FET with a highly doped source/drain and strain booster are presented. The method provides a substrate with a Ge channel region. A gate dielectric is formed over the Ge channel and a gate electrode is formed over the gate dielectric. Sacrificial gate spacers are disposed on the sidewalls of the gate dielectric and gate electrode. Cavities are etched into the substrate extending under the sacrificial gate spacers. $Si_{1-x}Ge_x$ source/drain regions are doped in-situ during formation, x<0.85.

18 Claims, 12 Drawing Sheets

OTHER PUBLICATIONS

Leys, F., "Epitaxial Si as a Passivation Method for Ge(100): Process Development, Physical and Electrical Characterization," IMEC, EPI-Workshop, Apr. 22, 2008, pp. 1-30.

Wu, N., et al., "BTI and Charge Trapping in Germanium p- and n-MOSFETs with CVD $HfO_2$ Gate Dielectric," IEEE, 2005, 4 pgs.

Weber, O., et al., "Strained Si and Ge MOSFETs with High-K/Metal Gate Stack for High Mobility Dual Channel CMOS," IEEE, 2005, 4 pages.

Lee, M. L., et al., "Strained Si, SiGe, and Ge Channels for High-Mobility Metal-Oxide-Semiconductor Field-Effect Transistors," Journal of Applied Physics 97, pp. 011101-011127, 2005, 27 pages.

Lee, M.L., et al., "Strained Ge Channel $p$-Type Metal—Oxide—Semiconductor Field-Effect Transistors Grown on $Si_{1-x}Ge_x$/Si Virtual Substrates," Applied Physics Letters, Nov. 12, 2001, vol. 79, No. 20, pp. 3344-3346.

Shang, H., et al., "Channel Design and Mobility Enhancement in Strained Germanium Buried Channel MOSFETs," 2004 Symposium on VLSI Technology Digest of Technical Papers, IEEE pp. 204-205.

Nicholas, G., et al., "High Mobility Strained Ge pMOSFETs with High-$_K$/Metal Gate," IEEE Electron Device Letters, Sep. 2007, pp. 825-827, vol. 28, No. 9.

Leys, F. E., et al., "Epitaxial Strained Si as a Passivation Method for the Ge/High-k Interface in Ge MOSFET Structures: Current Understanding and Future Directions," 2 pages, May 2008.

Cheng, C.-C., et al., "Ultrathin Si Capping Layer Suppresses Charge Trapping in $HfO_xN_y$/Ge Metal-Insulator-Semiconductor Capacitors," Applied Physics Letters 90, 2007, pp. 012905-1-012905-3.

Mitard, J., et al., "Record Ion/Ioff Performance for 65nm Ge pMOSFET and Novel Si Passivation Scheme for Improved EOT Scalability," 4 pages, Dec. 2008.

Mitard, J., et al., "Si-interface in Ge Devices: Process Window for Optimal Performance," IMEC; Explore: Ge III-V Program, 2007, 30 pages.

Kita, K., et al., "Direct Evidence of GeO Volatilization from $GeO_2$/Ge and Impact of Its Suppression on $GeO_2$/Ge Metal-Insulator-Semiconductor Characteristics," Japanese Journal of Applied Physics, 2008, pp. 2349-2353, vol. 47, No. 4.

Kuzum, D., et al., "Interface-Engineered Ge (100) and (111), N- and P-FETs with High Mobility," IEEE, 2007, pp. 723-726.

Brammertz, G., et al., "GaAs on Ge for CMOS," IMEC, 2007, 21 pages.

Prabhakaran, K., et al., "Distinctly Different Thermal Decomposition Pathways of Ultrathin Oxide Layer on Ge and Si Surfaces," Applied Physics Letters, Apr. 17, 2000, vol. 76, No. 16, pp. 2244-2246.

Yeo, C. C., et al., "Metal Gate/High-$K$ Dielectric Stack on Si Cap/Ultra-Thin Pure Ge epi/Si Substrate," IEEE, 2005, pp. 107-110.

Pourtois, G., et al., "A Step Towards a Better Understanding of Silicon Passivated (100) Ge P-Channel Devices," IMEC, ECS Spring Meeting, 2007, 29 pages.

Sareen, A., et al., "Effect of Si Cap Layer on Parasitic Channel Operation in Si/SiGe Metal—Oxide—Semiconductor Structures," Journal of Applied Physics, Mar. 15, 2003, vol. 93, No. 6, pp. 3545-3552.

Goel, N., et al., "Addressing the Gate Stack Challenge for High Mobility $In_xGa_{1-x}As$ Channels for n-FETs," IEDM, Dec. 16, 2008, 53 pages.

Brotzmann, S., et al., "Intrinsic and Extrinsic Diffusion of Phosphorus, Arsenic, and Antimony in Germanium," Journal of Applied Physics 103, 2008, pp. 033508-1-033508-7.

Miotto, R., et al., "First-Principles Study of the Adsorption of $PH_3$ on Ge(001) and Si(001) Surfaces," Brazilian Journal of Physics, Jun. 2002, 7 pages, vol. 32, No. 2a.

Zhang, Q., et al., "Drive-Current Enhancement in Ge n-Channel MOSFET Using Laser Annealing for Source/Drain Activation," IEEE Electron Device Letters, Sep. 2006, pp. 728-730, vol. 27, No. 9.

Satta, A., et al., "P Implantation Doping of Ge: Diffusion, Activation, and Recrystallization," J. Vac. Sci. Technol. B vol. 24(1), Jan./Feb. 2006, pp. 494-498.

Satta, A., et al., "Diffusion, Activation, and Regrowth Behavior of High Dose P Implants in Ge," Applied Physics Letters 88, 2006, pp. 162118-1-16 2118-3.

Chui, C. O., et al., "Activation and Diffusion Studies of Ion-Implanted $p$ and $n$ Dopants in Germanium," Applied Physics Letters, Oct. 20, 2003, vol. 83, No. 16, pp. 3275-3277.

Chui, C. O., et al., "Germanium $n$-Type Shallow Junction Activation Dependences," Applied Physics Letters 87, 2005, pp. 091909-1-091909-3.

Koike, M., et al., "Diffusion and Activation of $n$-Type Dopants in Germanium," arXiv:cond-mat/0703708v3, Sep. 28, 2007, 6 pages.

* cited by examiner

N-FET WITH A HIGHLY DOPED SOURCE/DRAIN AND STRAIN BOOSTER

TECHNICAL FIELD

The present invention relates generally to the manufacturing of semiconductor devices, and more particularly to a structure and method of making an N-FET with a highly doped source/drain and strain booster.

BACKGROUND

An important goal for the semiconductor industry is decreasing the size of semiconductor devices while increasing semiconductor performance. Planar transistors, such as metal oxide semiconductor field effect transistors (MOSFETs), are well suited for use in high-density integrated circuits (ICs).

Higher speed MOSFETs can be formed using strained device technology. One manufacturing method involves epitaxial growth of silicon on top of a relaxed silicon-germanium under layer. Tensile strain is induced in the silicon as the lattice of the silicon layer is stretched to mimic the larger lattice constant of the underlying silicon-germanium. Conversely, compressive strain could be induced by using a solid solution with a smaller lattice constant, such as silicon-carbon. Another closely related method involves replacing the source/drain region of a MOSFET with silicon-germanium.

One method of strained device technology is to deposit a layer of silicon-germanium (SiGe) on a bulk silicon wafer. The crystalline structure of SiGe is diamond, which is the same as silicon. However, the lattice constant in the SiGe is greater than that in Si. Therefore, when a thin silicon layer (thinner than critical thickness) is deposited on top of the SiGe layer the silicon crystal lattice may strain to align the silicon atoms with the atoms in the SiGe layer. Electrons in strained silicon experience less resistance and flow faster than in unstrained silicon, thus, increasing transistor performance.

Further methods of building high speed MOSFETs include Ge MOSFETs. Ge MOSFETs have a high intrinsic carrier mobility, which improves device speed. However, dopant activation in source/drain regions may be an issue in current Ge MOSFETs, especially the N-type MOSFET or N-FET. The external resistance of the Ge N-FET transistor may be greater than the external resistance of a conventional N-FET transistor. External resistance comprises the sum of the resistances associated with the ohmic contacts (metal to semiconductor and semiconductor to metal), the resistances within the source/drain region itself, the resistances of the region between the channel region and the source/drain regions (i.e. the source/drain extensions), and the interface resistances due to impurity (carbon, nitrogen, oxygen) contamination at the location of the initial substrate-epi-layer interface. The external resistance may reduce transistor performance.

For instance, the drive current of the N-FET may be impacted negatively if the external resistance of the N-FET is high. Drive current is the drain current of a MOS transistor with gate and drain connected to the supply voltage, and source and bulk grounded. Drive current is a significant device performance parameter.

Further, a desired low value for drain induced barrier lowering (DIBL) may not be achieved in high external resistance N-FET structures. DIBL is the measure of a transistor in the weak inversion regime. A potential barrier between the source and the channel region exists. The height of this barrier is a result of the balance between drift and diffusion current between the source and the channel region. If a high drain voltage is applied, the barrier height can decrease leading to an increased drain current. Thus, the drain current is controlled not only by the gate voltage, but also by the drain voltage. This parasitic effect can be accounted for by a threshold voltage reduction depending on the drain voltage.

Thus, there are challenges due to scaling planar bulk CMOS because of the high channel doping required to reduce the parasitic series source/drain resistance (Rsd) to acceptable values while employing shallow source/drain junction depth. What is needed then is a shallow, highly doped source/drain with reduced Rsd that provides a beneficial transistor strain.

SUMMARY OF THE INVENTION

These and other problems are generally solved or circumvented and technical advantages are generally achieved by a structure and method of making an N-FET with a highly doped source/drain and strain booster.

In accordance with an illustrative embodiment of the present invention, a method of making an N-type field effect transistor (N-FET) is presented. The method provides a substrate with a Ge channel region. A gate dielectric is formed over the Ge channel and a gate electrode is formed over the gate dielectric. Sacrificial gate spacers are disposed on the side walls of the gate dielectric and gate electrode. Cavities are etched into the substrate extending under the sacrificial gate spacers. $Si_{1-x}Ge_x$ source/drain regions are doped in-situ during formation, $x<0.85$.

Advantages of preferred embodiments of the present invention include providing a high speed MOSFET with reduced parasitic series source/drain resistance (Rsd) and a shallow source/drain junction depth.

A further advantage is providing a tensile strain on the N-FET channel region thereby increasing carrier mobility, thus increasing drive current.

The foregoing has outlined rather broadly the features and technical advantages of an illustrative embodiment in order that the detailed description of the invention that follows may be better understood. Additional features and advantages of an illustrative embodiment will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the illustrative embodiments as set forth in the appended claims.

BRIEF DESCRIPTION OF THE DRAWINGS

For a more complete understanding of the illustrative embodiments, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that an illustrative embodiment provides many applicable inventive concepts that can be embodied in a wide variety of specific contexts. The specific embodiments discussed are merely illustrative of specific ways to make and use the invention, and do not limit the scope of the invention.

The present invention will be described with respect to illustrative embodiments in a specific context, namely a semiconductor device having a Ge N-FET with a highly doped source/drain and strain booster. The invention may also be applied, however, to other semiconductor devices.

Figure 1A:
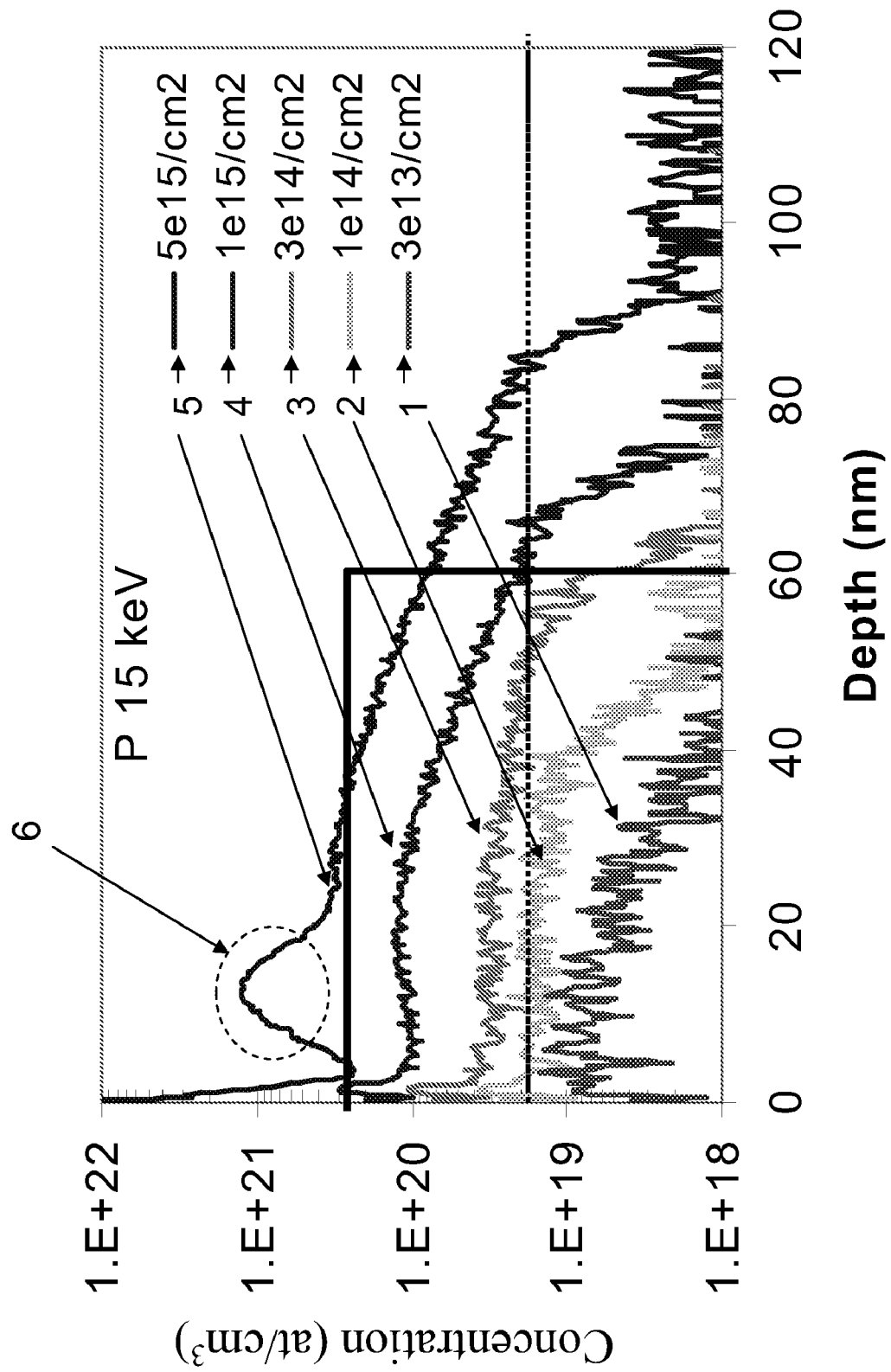
FIG. 1a is a graph of phosphorous concentration versus depth for implanted phosphorous.
Figure 1B:
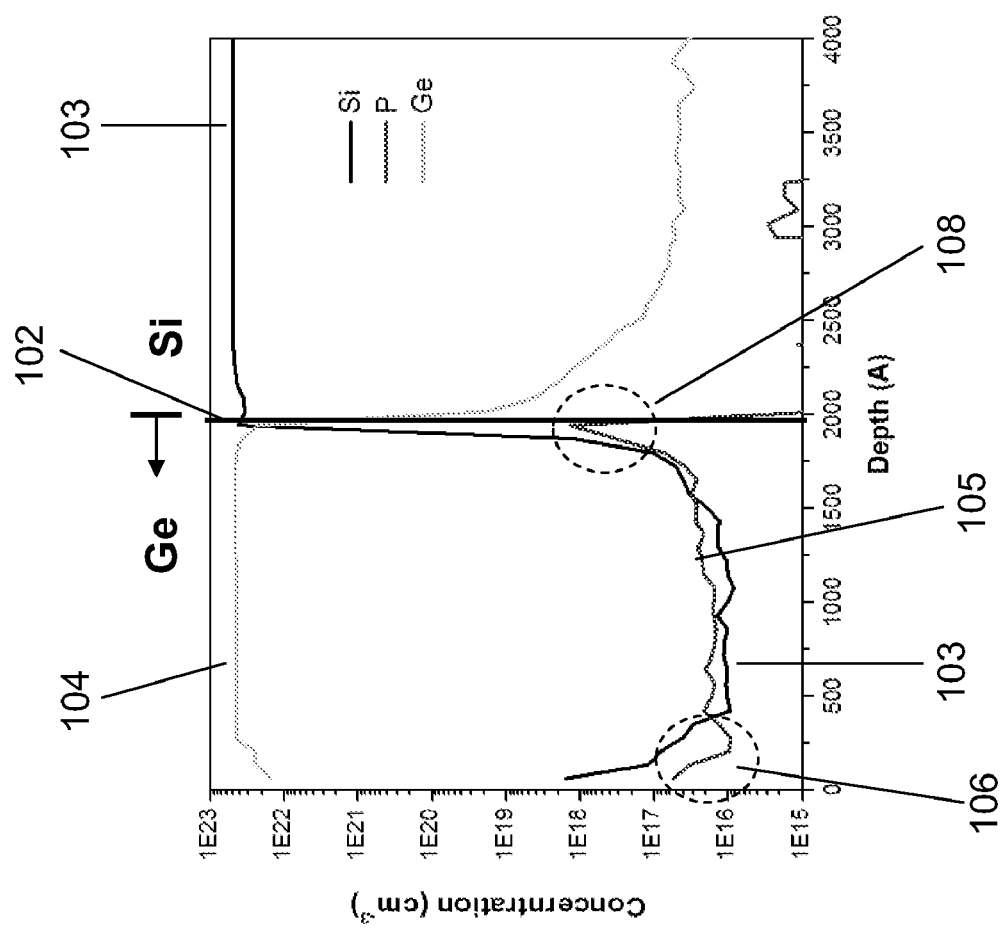
FIG. 1b is a graph of phosphorous concentration in a multiple layer Ge/Si structure.
Figure 1C:
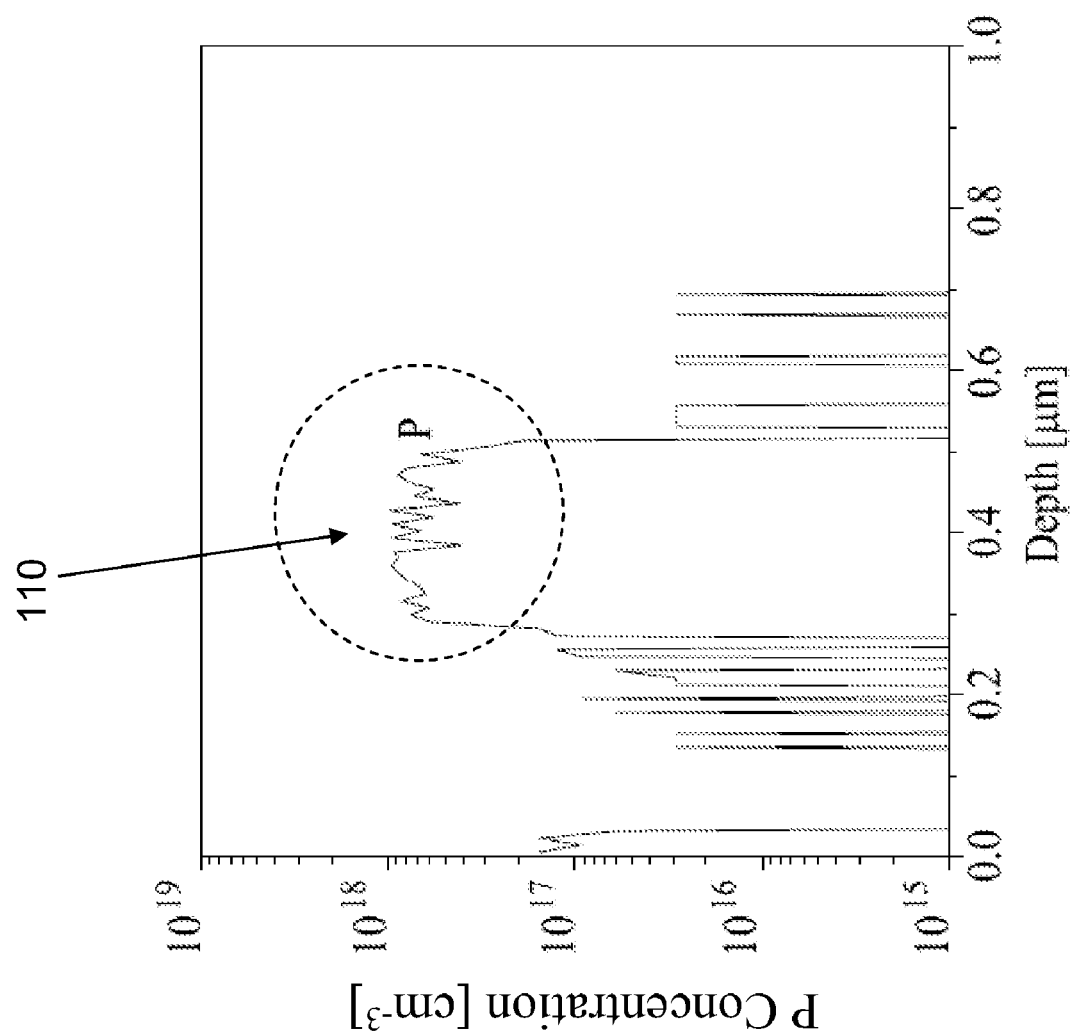
FIG. 1c is a graph of phosphorous concentration in a SiGe layer.

With reference now to FIG. 1a, a graph of phosphorous concentration versus depth for an implanted substrate is shown. FIG. 1b is a graph illustrating the phosphorous concentration in a multi-layer Ge and Si structure. FIG. 1c is a graph of phosphorous concentration in a SiGe layer.

Turning first to FIG. 1a, the y-axis indicates phosphorous concentration per cubic cm. The x-axis indicates the depth of the measurement in nm for a phosphorous implanted Ge substrate. The curves 1-5 indicate the doping concentrations for different implanted doses (all implants at 15 keV). Curve 1 corresponds to an implanted dose of 3 E+13, curve 2 to an implanted dose of 1 E+14, curve 3 to an implanted dose of 3 E+14, curve 4 to an implanted dose of 1 E+15, and curve 5 to an implanted dose of 5 E+15. Curve 1 shows a phosphorous concentration in the 1 E+19 range at a depth of 20 nm decreasing to the 1 E+18 range at around 40 nm. Moreover, curves 2, 3, and 4 are similar curves showing an expected increase in phosphorous concentration versus implanted dose. Curve 5, however shows anomaly 6 that indicates phosphorous precipitation at phosphorous concentrations in a range greater than 2 E+20 in the implanted substrate at a depth of about 18 nm. This non-uniformity in the desired phosphorous concentration range is not optimal for high performance reliable semiconductor devices and therefore other methods rather than implant must be adopted to dope the N+ source/drain regions.

Turning next to FIG. 1b, the y-axis indicates concentration per cubic cm. The x-axis indicates the depth of the measurement in Å. Line 102 dividing the graph indicates the interface between the Ge layer on the left and the Si layer on the right. Ge concentration curve 104 indicates the expected high level of Ge in the Ge layer and the low level of Ge in the Si layer. Si curve 103 indicates the low concentration of Si in the Ge layer and the high level of Si in the Si layer. Phosphorous curve 105 illustrates the concentration of phosphorous in the Ge layer and the Si layer. The concentration of phosphorous is between 1 E+16 and 1 E+17 throughout the Ge layer. There is a peak concentration of phosphorous at a surface depth (see area 106) and a peak concentration of phosphorous at the interface between the Ge and Si layer (see area 108). The level of phosphorous concentration is undesirably low and non-uniform for use as a source/drain structure in the illustrative embodiments. Thus, it is clear that neither pure Ge nor pure Si is the optimal choice for a highly doped source/drain region.

In contrast, however, turning to FIG. 1c, a uniformly doped region is observed in a layer of SiGe. The concentration of phosphorous in the SiGe layer is shown along the y-axis in atms/cm³. Note the markings of the Si cap layer and the Si bulk layer on either side of the SiGe layer. The depth of the measurement within the SiGe layer is shown on the x-axis in gms. As is apparent from the graph, (see area 110 indicated) the concentration of phosphorous in the SiGe layer is substantially uniform. The concentration of phosphorous in area 110 is about 1 E+18. Thus, the SiGe layer shows a desirable uniform doping profile for the implementation of a SiGe source/drain structure for an n-channel MOSFET.

Figure 2:
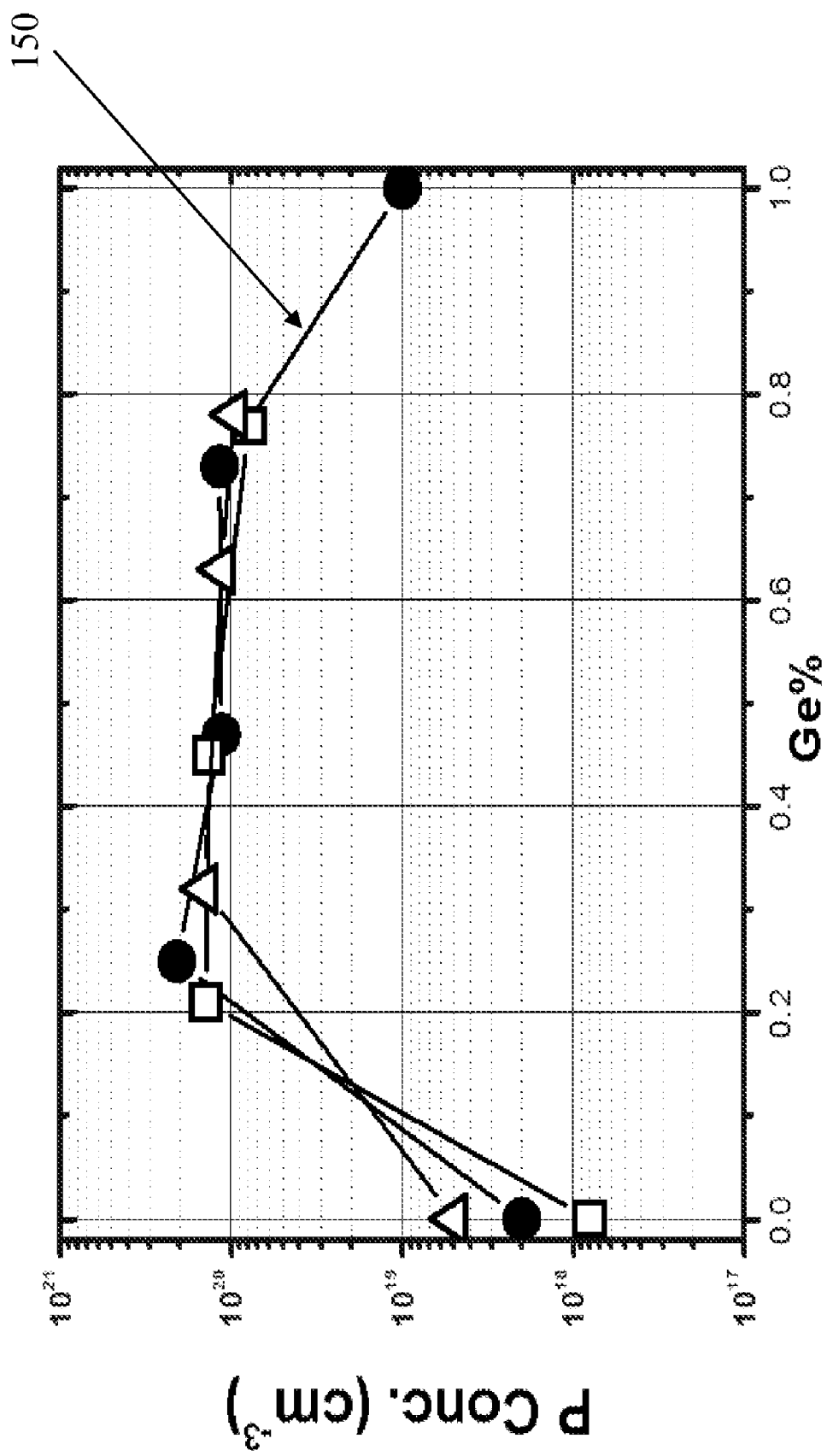
FIG. 2 shows a graph of the phosphorous concentration in the SiGe N-FET source/drain region.

Turning to FIG. 2, a graph of phosphorous concentration by percent Ge in a SiGe layer is shown. The three curves shown in FIG. 2 represent three similar data sets. Curve 150 is discussed herein as representative of the three curves. Curve 150 approximates an average phosphorous concentration for a percentage of Ge in the SiGe layer. The y-axis shows the phosphorus concentration in atms/cm³. The x-axis shows the percentage of Ge in the SiGe layer. All data points where taken from SiGe layers that were produced using an in-situ phosphorus process.

Curve 150 indicating data with a percentage of Ge below 15% shows a phosphorous concentration below about 5 E+19 atms/cm³. Data with a Ge percentage above 85% indicates a phosphorous concentration below about 3 E+19 atms/cm³. However, data with Ge percentages between about 15% and about 85% indicates a phosphorous concentration about 1 E+20 atms/cm³, which is acceptably high and uniform. Therefore, a desirable Ge percentage range in the SiGe layer is about 15% to about 85%, or more preferably about 50% to 85% Ge. The higher Ge content may improve defect density by reducing crystalline misfit defects.

Figure 3:
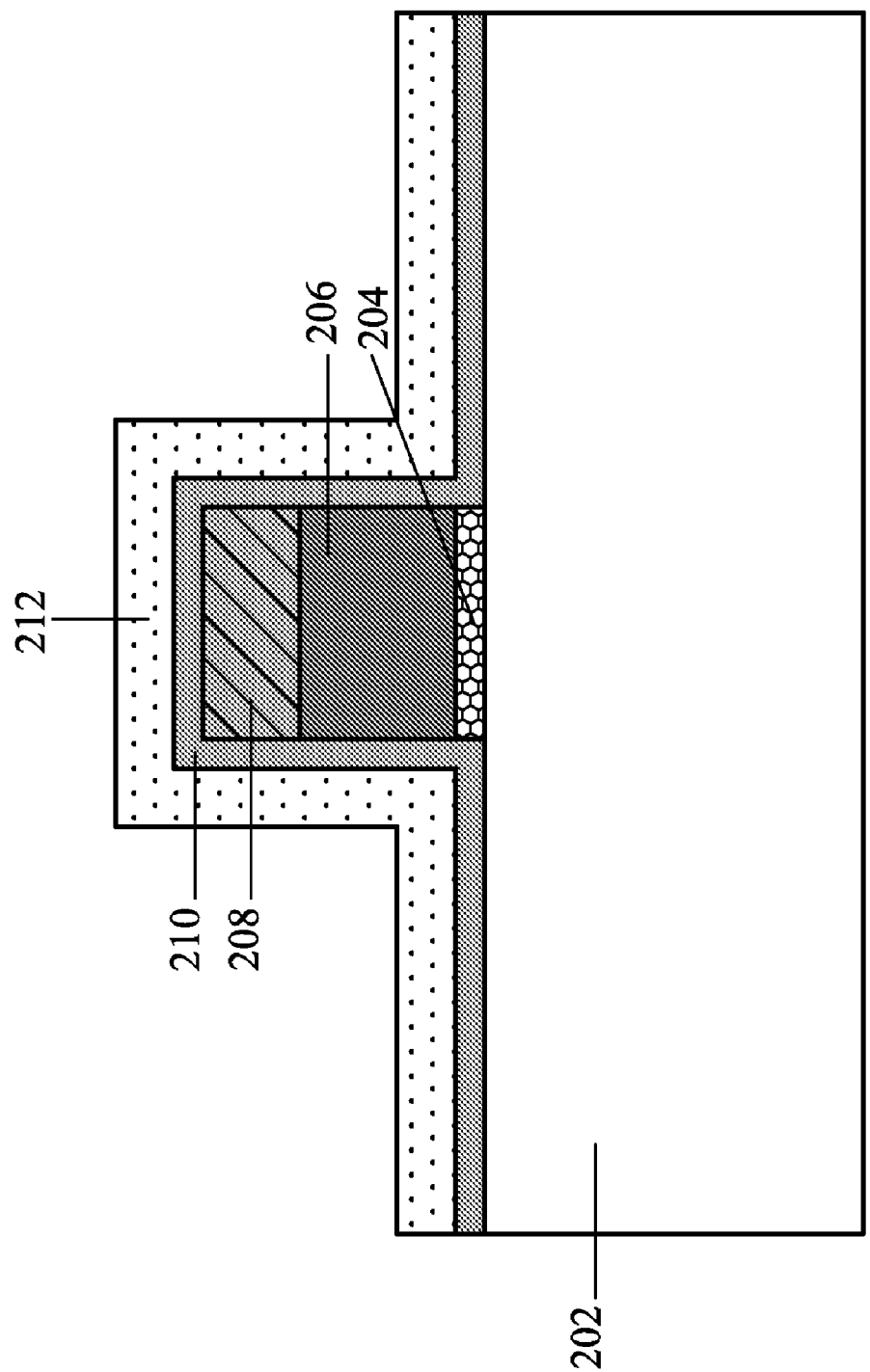
FIGS. 3-9 show cross-sectional views of selected process steps in forming N-FET with a Ge channel region in accordance with an illustrative embodiment.

FIGS. 3-9 show cross-sectional views of selected process steps in making a Ge N-FET in accordance with an illustrative embodiment. Turning first to FIG. 3, a cross-section of an N-FET at a selected processing step is shown. Substrate 202 may comprise bulk Ge, a Ge layer on Si or GOI (germanium on insulator). In the embodiment illustrated in FIGS. 3-9, substrate 202 is Ge bulk.

Gate dielectric 204 may be comprised of Si oxide, Ge oxide, Ge nitride, Ge oxynitride, (Si, Ge)Ox, high-k material, or combinations thereof. High-k material may have a dielectric constant greater than about 4 and preferably greater than about 7. High-k material may comprise metal oxides such as; $HfO_2$, $HfSiO_x$, $HfZrO_x$, $HfZrSiO_x$, HfSiON, $Al_2O_3$, $LaAlO_3$, $ZrO_2$, Zr silicate, and the like, for example. Gate electrode 206 may comprise polysilicon, either doped or undoped, or another conductive material, such as a metal or silicide. Hard mask 208 may be an oxide or a nitride used to define the gate during the gate photolithography processes. Liner layer 210 may comprise an oxide, other insulating layer, or the like. Spacer layer 212 may comprise a nitride, other insulating layer, or the like.

Figure 4:
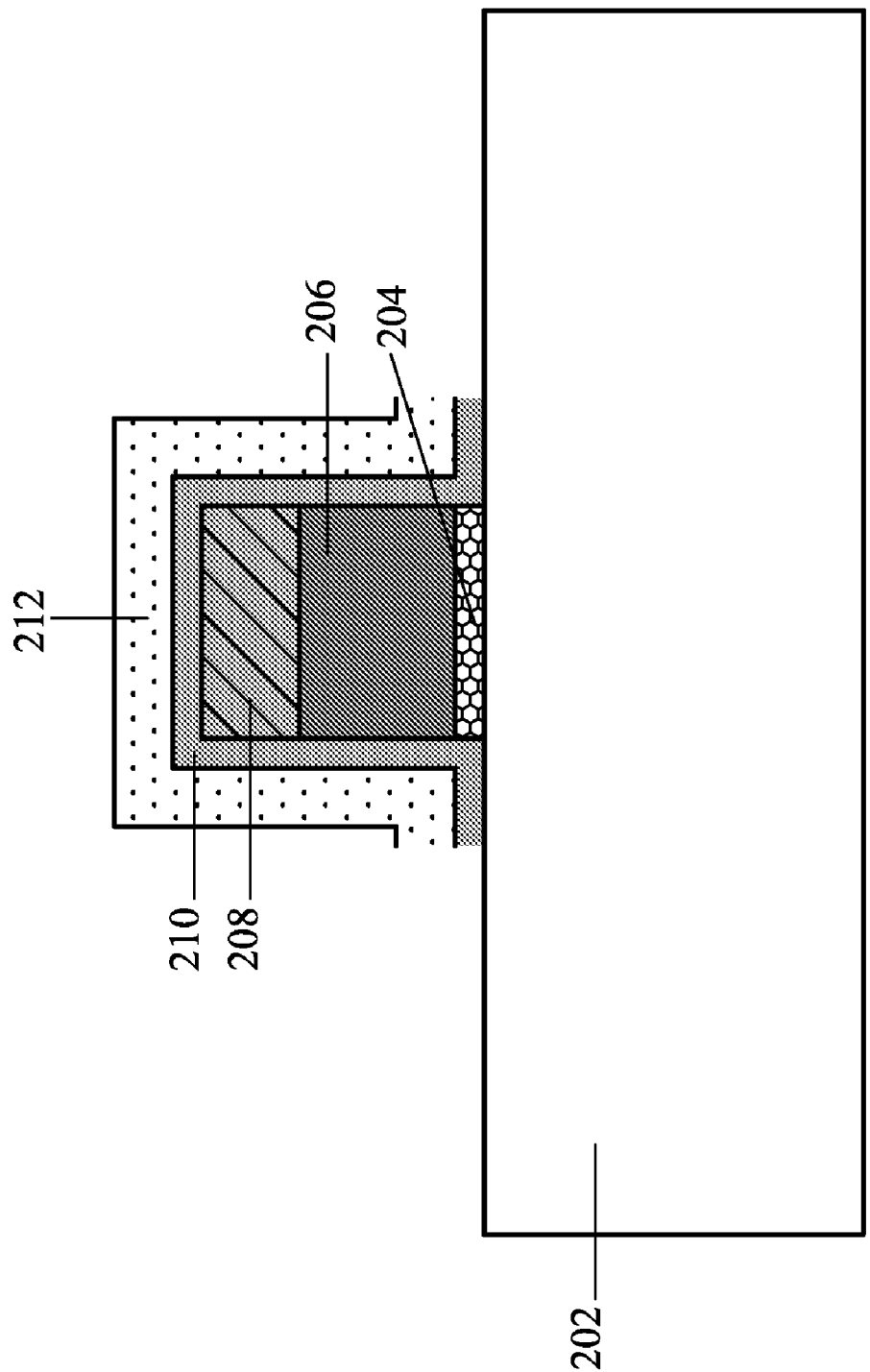

FIGS. 4-9 show a similar N-FET as is shown in FIG. 3, with like layers repeated and numbered as in FIG. 3. Therefore, each layer will not again be described in detail in conjunction with FIGS. 3-9. In FIG. 4, a portion of liner layer 210 and a portion of spacer layer 212 are removed from the source/drain regions in preparation for a source/drain etching process. Liner layer 210 and spacer layer 212 may be etched using a standard patterned etch (pattern not shown), wet etch, or dry etch, as is known in the art.

Figure 5:
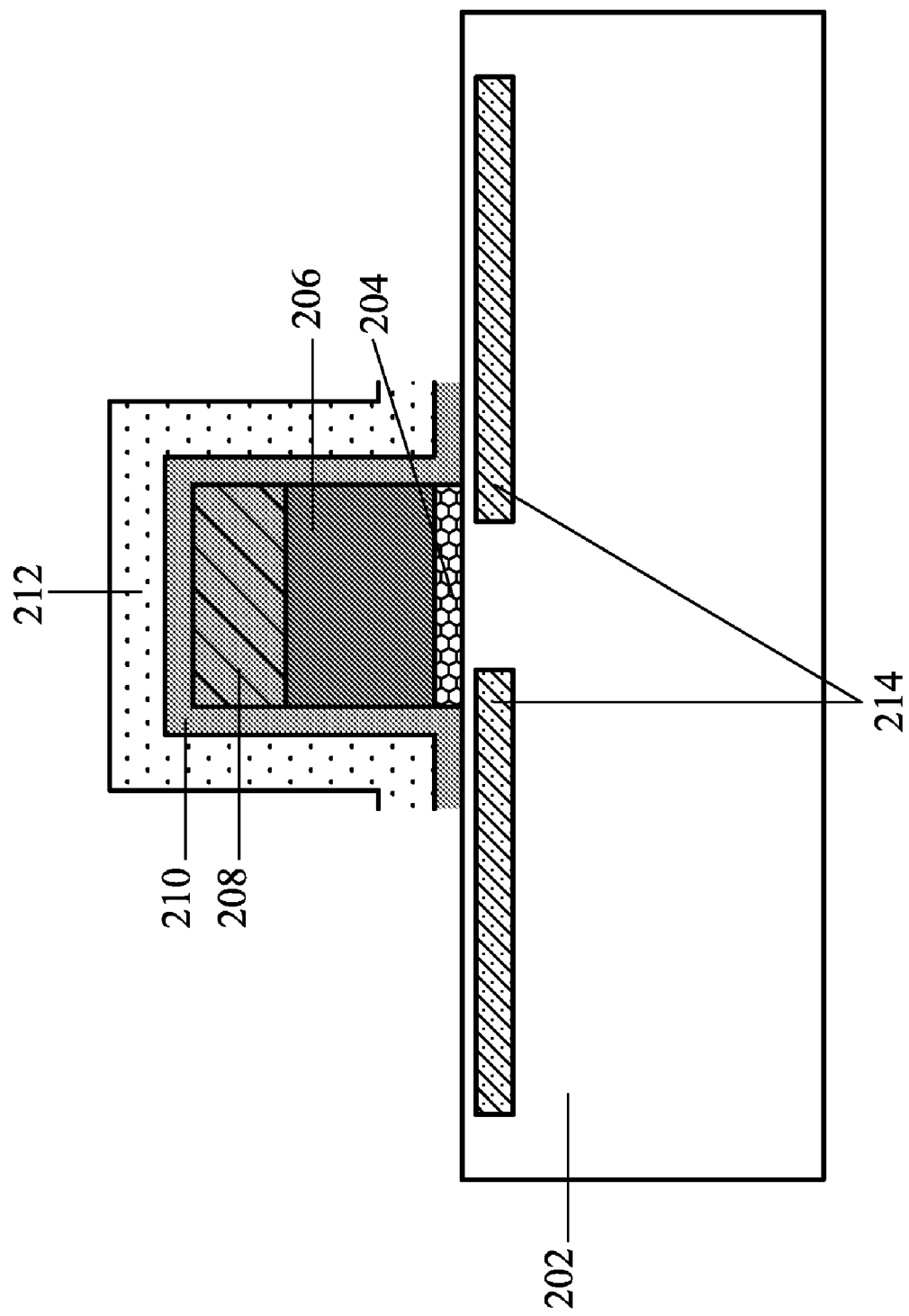

FIG. 5 shows lightly doped source/drain (LDD) and/or halo implanted regions 214. The dopant concentration may be 1 E+15 to 1 E+19 per cubic cm, depending on the specific design constraints and electrical results required. Moreover, the implant may be performed at a tilt, or multiple tilts, to tuck the LDD or halo implants under the gate dielectric, for example.

Figure 6:
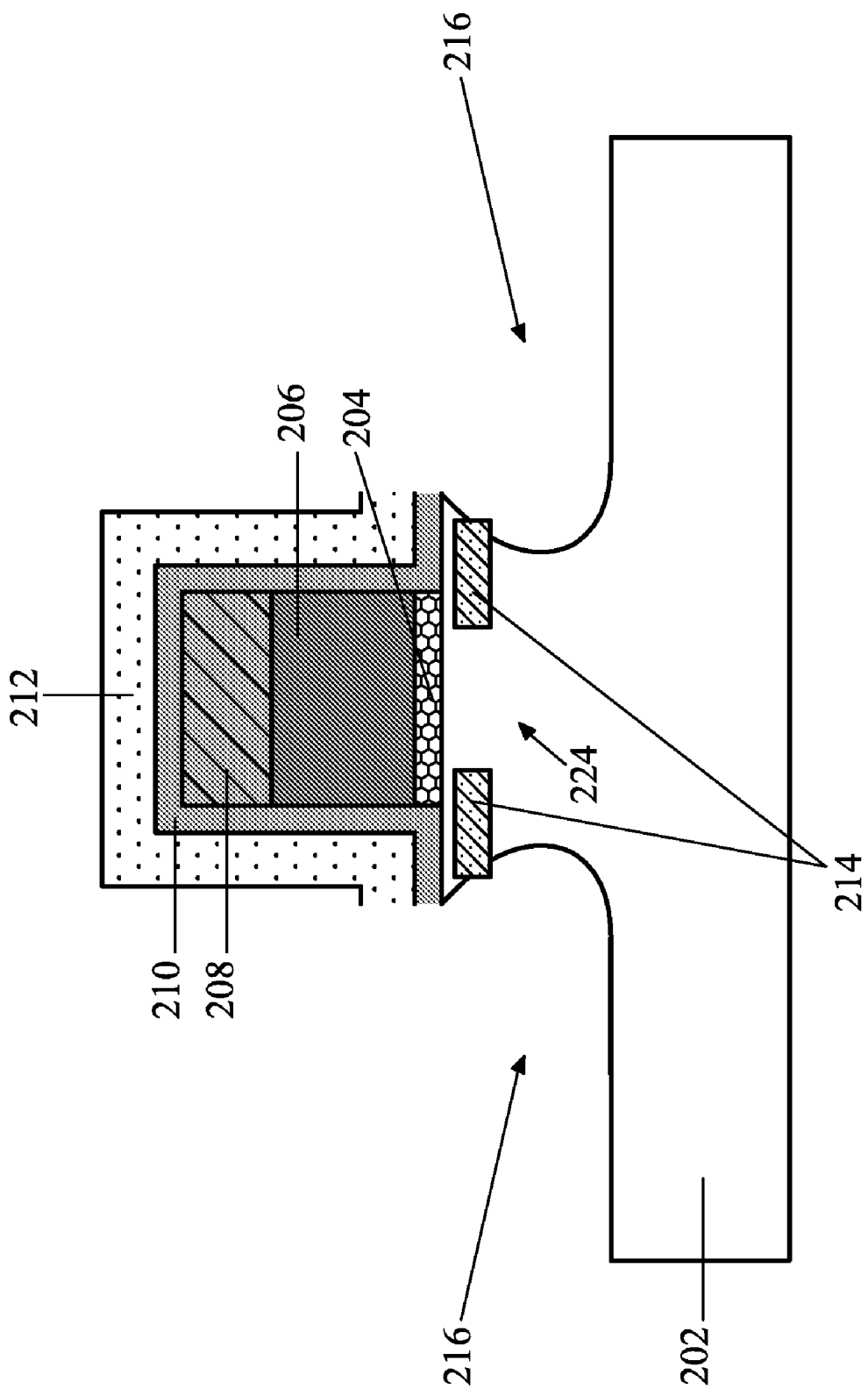

Turning to FIG. 6, a cross-sectional depiction of an N-FET following an etch of the source/drain regions 216 is depicted. The etching process may be a wet or dry isometric etch. The etchant KOH may be used. Note that the etch undercuts the substrate under spacer layer 212. Only a portion of the previously implanted LDD and/or halo implanted regions 214 remains. Further, note that the substrate region directly under the gate dielectric remains intact, forming channel region 224.

Figure 7:
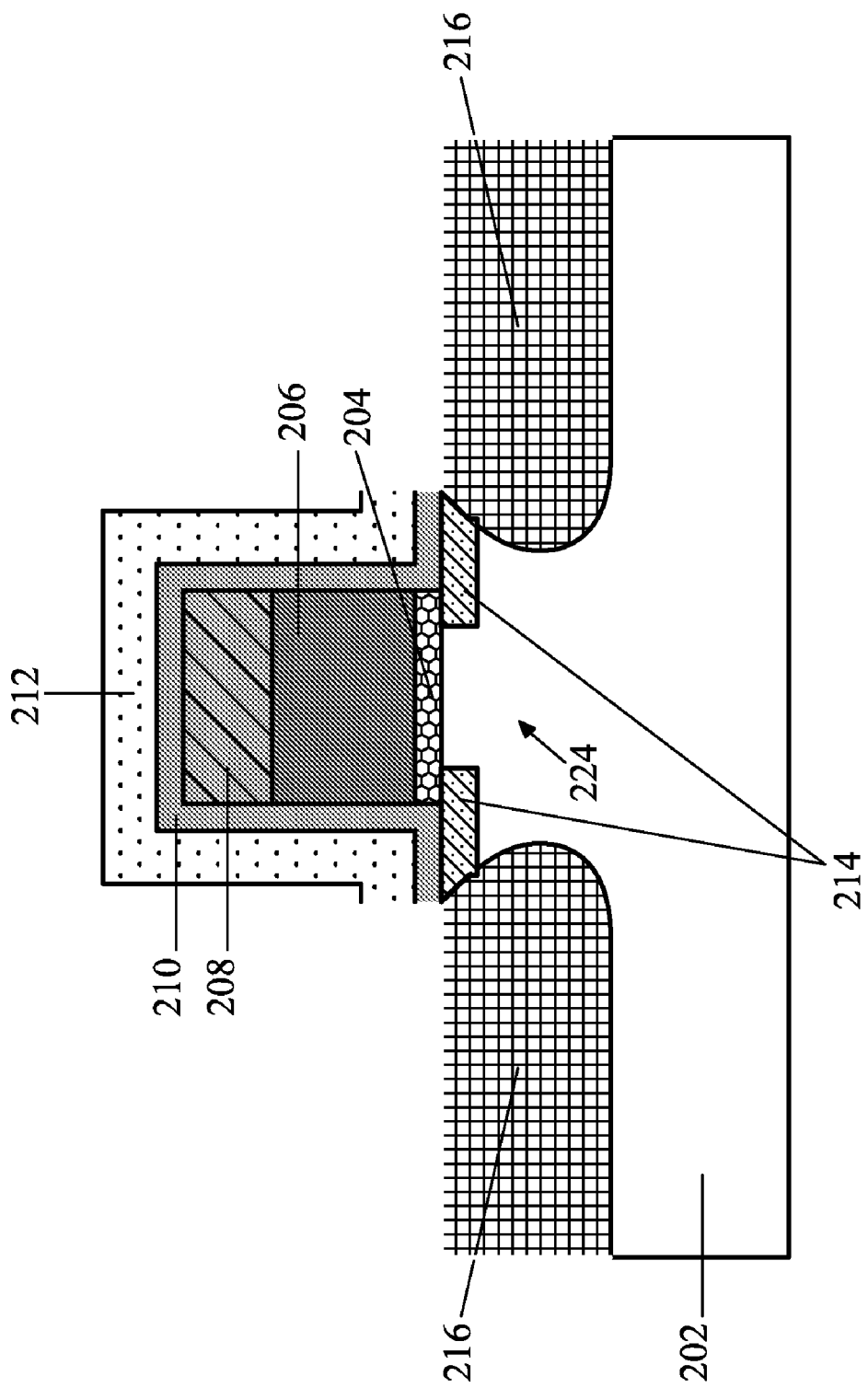

FIG. 7 shows source/drain regions 216 filled with a phosphorous in-situ doped $Si_{1-x}Ge_x$ (x<0.85) in accordance with an illustrative embodiment. Source/drain regions 216 create a tensile strain on channel region 224. The tensile strain on channel region 224 enables charge carriers, in this case electrons, to move at a greater speed through channel 224. Further, source/drain regions 216 are in-situ doped as shown by the data on the graph in FIG. 1c. Moreover, the phosphorous in-situ doping may be more uniform and more dopant may be activated than in prior art methods. In another embodiment, other n-type dopants may be used in place of or in addition to phosphorous, including As and Sb, for example.

In-situ doped source/drain regions 216 may be formed in an epi reactor using gases such as $GeH_4$ or $Ge_2H_6$ for the Ge source, and $SiH_4$, $SiH_2Cl_2$, $Si_2H_6$, and $CH_3SiH_3$ gases for the Si source. The Ge percentage of the film is between about 15% to about 85%, preferably between 50% and 85% for better process control. The dopant may be introduced into the film using a $PH_3$ gas with a partial pressure of between about 0.005 Pa and about 0.5 Pa. Carrier gases such as He, $N_2$ and $H_2$ may also be used. The process may be performed in a low pressure environment, such as an environment at less than about 100 torr, or in an atmospheric pressure environment. The temperature of the process may be between about 350° C. and about 650° C. The phosphorous dopant concentrations produced may be between 5 E+19 and 2.5 E+20 atms/cm³. The source/drain regions may be co-planar with the surface of substrate 202 (in this case the Ge bulk) or the source/drain regions may be raised above substrate 202.

Figure 8:
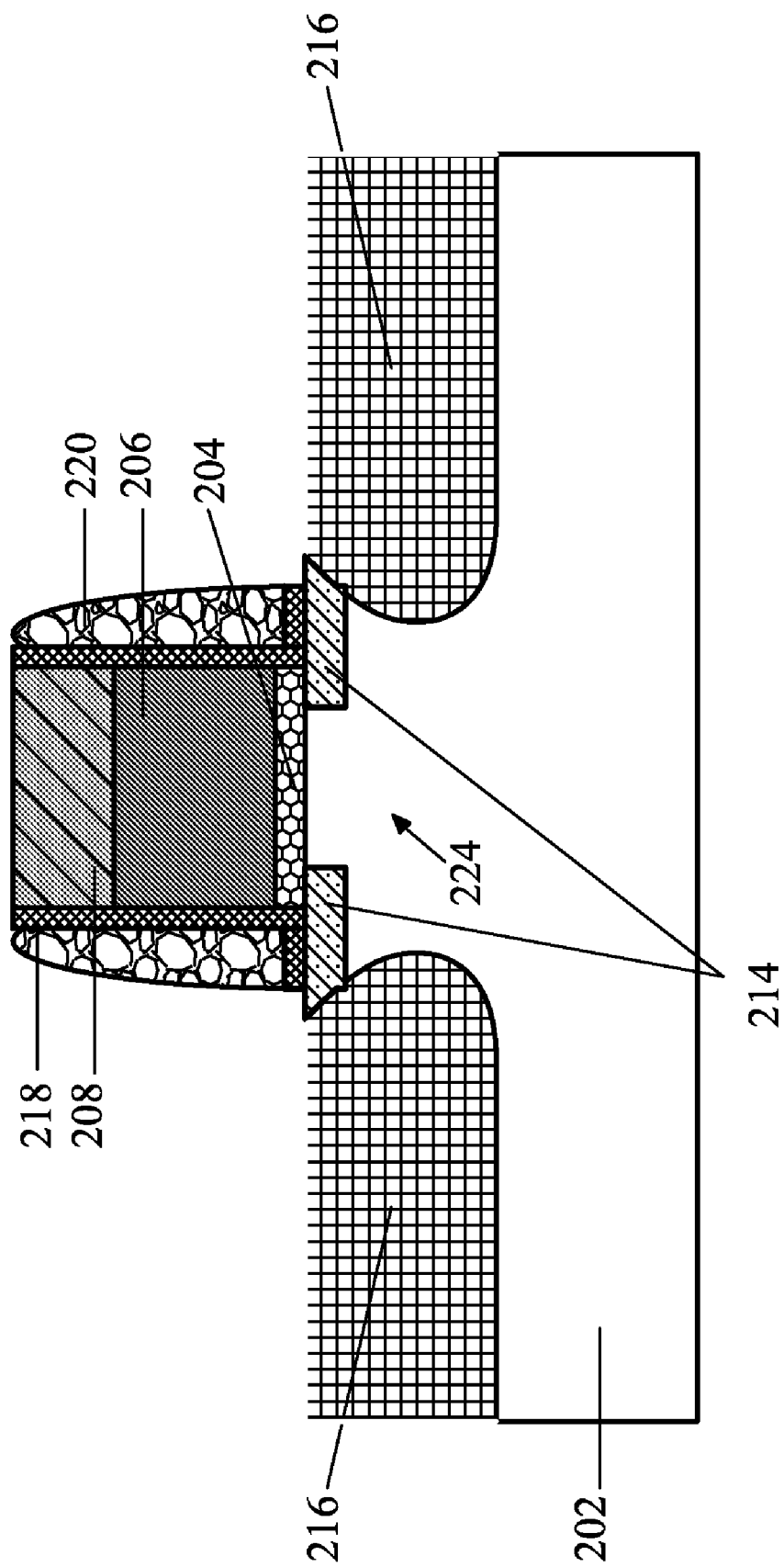

Turning to FIG. 8, a resultant N-FET cross-section is shown following the formation of sidewall spacers 220. Gate liner 218 may be newly formed following the removal of liner layer 210, or gate liner 218 may be an etched version of liner layer 210. Gate liner 218 is an isolation layer, which is a dielectric comprised of an oxide, nitride, or the like. Sidewall spacers 220 may comprise a dielectric such as a nitride, an oxide, or the like, and are formed using methods well known in the art.

Figure 9:
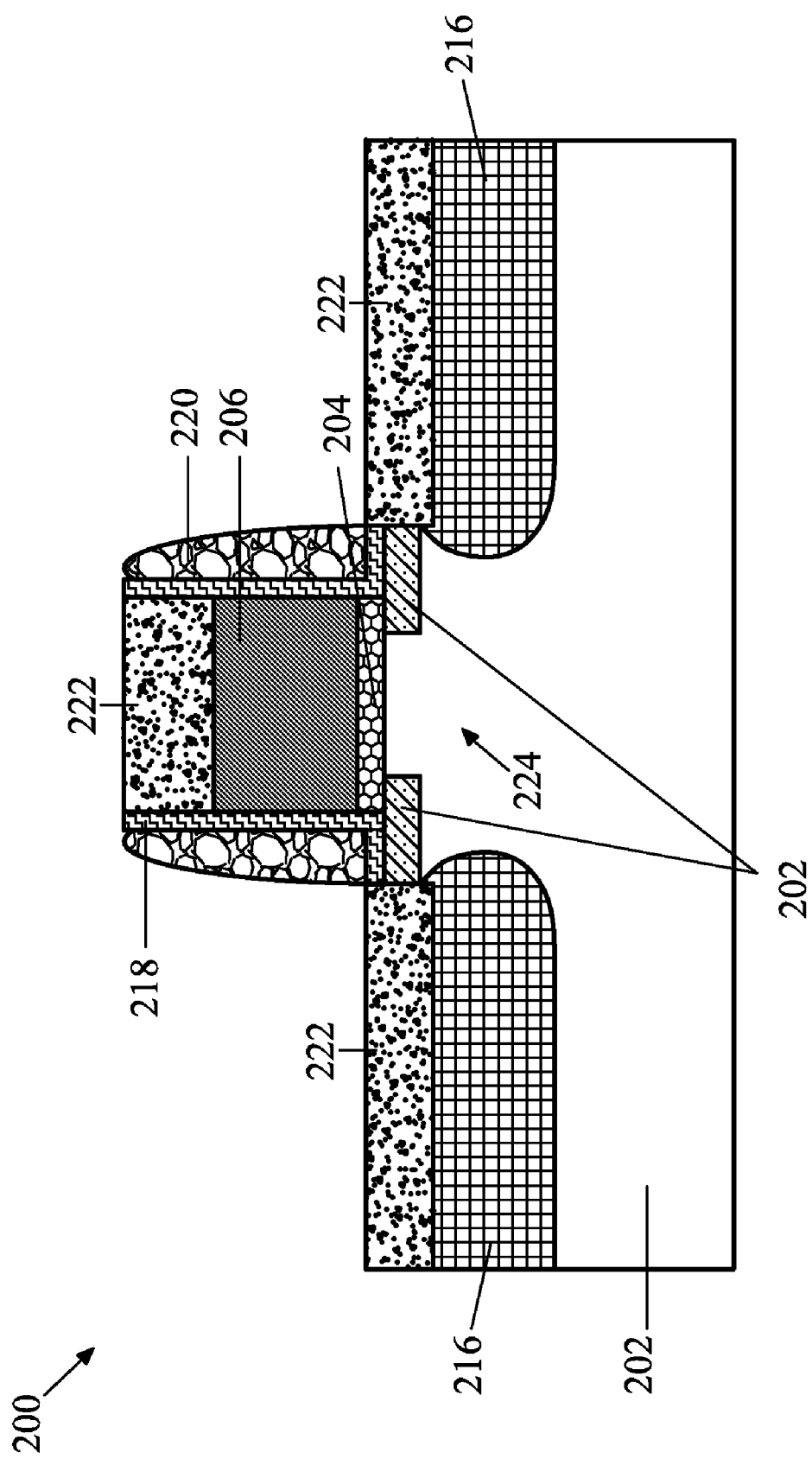

FIG. 9 shows a first illustrative embodiment of the N-FET with high dopant concentration in the shallow SiGe source/drain region. The substrate is Ge bulk or a Ge layer on Si. Channel region 224 is Ge under tensile stress. Source/drain regions 216 are phosphorous in-situ doped $Si_{1-x}Ge_x$, wherein x<0.85 or more preferably 0.50<x<0.85. First illustrative embodiment 200 shows halo implanted regions 214 extending slightly under the gate dielectric. Further, first illustrative embodiment 200 shows silicide 222 over gate electrode 206 and over source/drain regions 216. Silicide 222 may comprise NiGe, CoGe, TiGe, WGe, materials including Si, or other like material.

Figure 10:
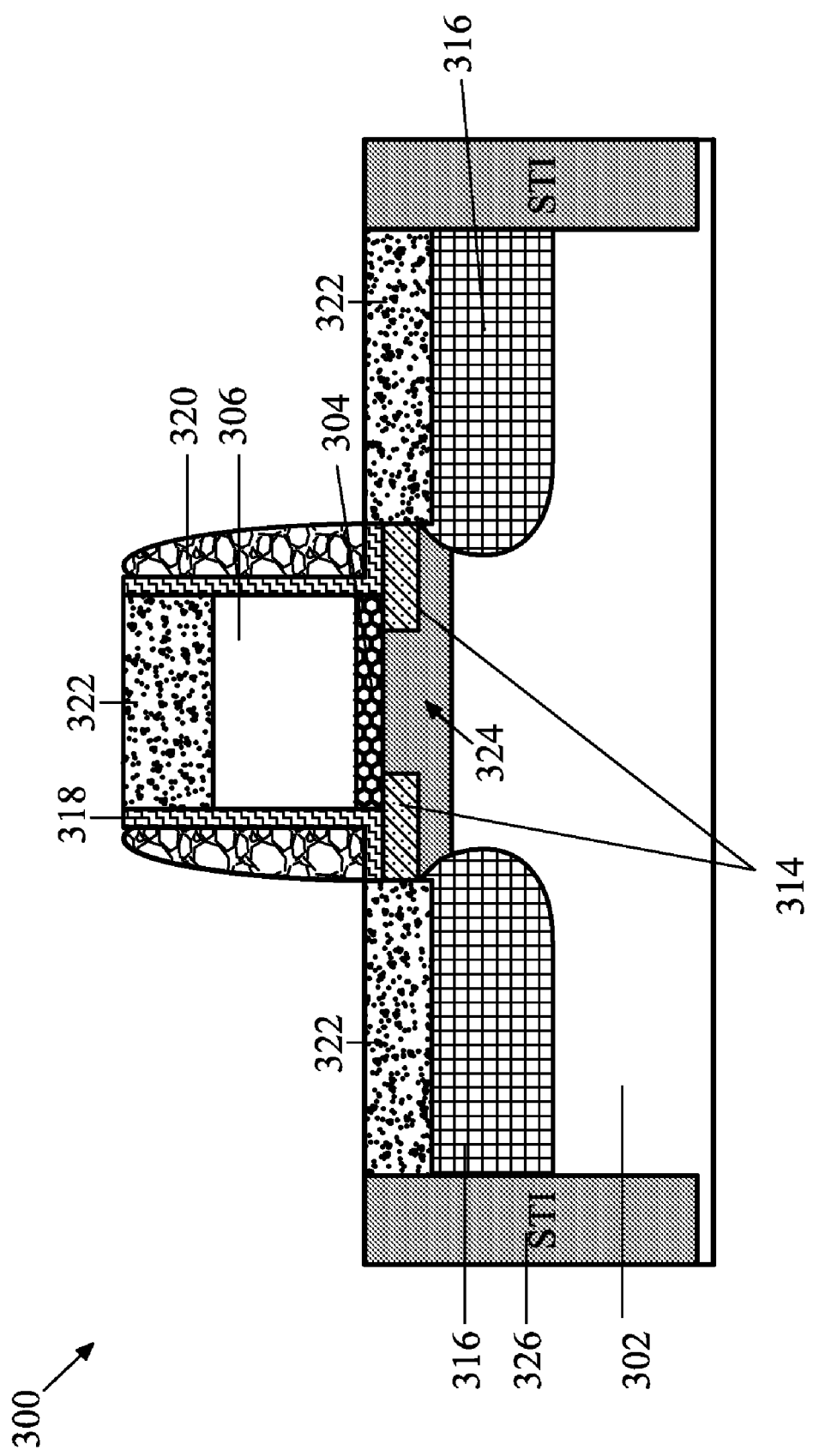
FIG. 10 shows a cross-sectional view of an N-FET with $Si_{1-x}Ge_x$ channel region in accordance with another illustrative embodiment.

FIG. 10 shows a cross-sectional view of an N-FET in accordance with a second illustrative embodiment. Substrate 302 may be comprised of $Si_{1-y}Ge_y$ on Si and the source/drain may be comprised of $Si_{1-x}Ge_x$, wherein y is less than 1 and less than x. Shallow trench isolation (STI) regions border the transistor. Gate dielectric 304 may be comprised of Ge oxide, Ge oxynitride, high-k material, or combinations thereof. High-k material may have a dielectric constant greater than about 4 and preferably greater than about 7. High-k material may comprise metal oxides such as; $HfO_2$, $HfSiO_x$, $HfZrO_x$, $HfZrSiO_x$, $HfSiON$, $Al_2O_3$, $LaAlO_3$, $ZrO_2$, Zr silicate and the like, for example. Gate electrode 306 may comprise polysilicon, either doped or undoped, or another conductive material, such as a metal or silicide.

Gate liner 318 is an isolation layer, which is a dielectric comprised of an oxide, nitride, or the like. Sidewall spacers 320 may comprise a dielectric such as a nitride, an oxide, or the like and are formed using methods well known in the art.

In-situ doped source/drain regions 316 may be formed in an epi reactor using gases such as $GeH_4$ or $Ge_2H_6$, for the Ge source, and $SiH_4$, $SiH_2Cl_2$, $Si_2H_6$, and $CH_3SiH_3$ gases for the Si source. The Ge percentage of the film is preferably between about 15% to about 85%. The dopant may be introduced into the film using a $PH_3$ gas with a partial pressure of between about 0.005 Pa and about 0.5 Pa. Carrier gases, such as He, $N_2$ and $H_2$, may also be used. The process may be performed in a low pressure environment, such as an environment at less than about 100 torr, or in an atmospheric pressure environment. The temperature of the process may be between about 350° C. and about 650° C. The phosphorous dopant concentrations produced may be between 5 E+19 and 1.5 E+20 atms/cm³. In another embodiment, the in-situ doped $Si_{1-x}Ge_x$ source/drain regions have an N-type concentration of greater than about 8 E+19 atoms/cm³. The source/drain regions may be co-planar with the surface of substrate 302 (in this case the SiGe layer) or the source/drain regions may be raised above substrate 302.

Second illustrative embodiment 300 shows halo implanted regions 314 extending slightly under the gate dielectric and channel region 324 is under tensile strain from source/drain regions 316. Further, second illustrative embodiment 300 shows silicide 322 over gate electrode 306 and over source/drain regions 316. Silicide 322 may comprise NiGe, CoGe, TiGe, WGe, materials including Si, or other like material.

Additional deep source/drain implants may optionally be used in the illustrative embodiments to reduce the series resistance and to provide a good interface to the contacts. An optimum design of deep source/drain implants implies that they do not significantly affect device performance in the channel region of an N-FET transistor.

Further, in other illustrated embodiments, the source/drain regions may have a graded Ge profile, wherein the Ge content is lowest near the surface of the substrate and increases deeper in the source/drain regions. In yet other illustrative embodiments, the source/drain regions may contain carbon, such as $Si_{1-x}Ge_xC$, wherein x<1.

Advantages of embodiments include providing a method and structure wherein the series resistance of a shallow source/drain region is minimized. Further, the shallow source/drain region provides a tensile strain on the channel of the N-FET. Other advantages include improved drive current and DIBL device parameters.

Although the illustrative embodiments and their advantages have been described in detail, it should be understood that various changes, substitutions, and alterations can be made herein without departing from the spirit and scope of the invention as defined by the appended claims. As another example, it will be readily understood by those skilled in the art that the order of the process steps may be varied while remaining within the scope of the present invention.

Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of making an N-type field effect transistor (N-FET), the method comprising:
    providing a substrate with a Ge channel region;
    forming a gate dielectric over the Ge channel region;
    forming a gate electrode over the gate dielectric;
    disposing sacrificial gate spacers on the gate electrode and the gate dielectric;
    etching cavities into the substrate, wherein the cavities extend under sacrificial gate spacers; and
    forming in-situ doped $Si_{1-x}Ge_x$ source/drain regions in the cavities, wherein $0.15<x<0.85$; and
    decreasing x during the forming of the in-situ doped $Si_{1-x}Ge_x$ source/drain regions, thereby forming graded Ge source/drain regions.

2. The method of claim 1, wherein the substrate provided is comprised of bulk Ge, GOI, or Ge on Si.

3. The method of claim 1, wherein the cavities are etched to a depth of less than about 120 nm.

4. The method of claim 1, wherein the cavities are etched to a depth of between about 10 nm and about 100 nm.

5. The method of claim 1, wherein the in-situ doped $Si_{1-x}Ge_x$ source/drain regions further comprise carbon.

6. The method of claim 1, wherein the in-situ doped $Si_{1-x}Ge_x$ source/drain regions are doped with phosphorous, arsenic, antimony or a combination thereof.

7. The method of claim 1 further comprising forming a Ge silicide on the in-situ doped $Si_{1-x}Ge_x$ source/drain regions, the gate electrode, or both the in-situ doped $Si_{1-x}Ge_x$ source/drain regions and the gate electrode.

8. The method of claim 1, wherein forming the gate dielectric comprises disposing Ge oxide, Ge oxide nitride, high-k material, or a combination of Ge oxide, Ge oxide nitride, and high-k material.

9. The method of claim 1, wherein the in-situ doped $Si_{1-x}Ge_x$ source/drain regions have an N-type concentration of greater than about $8\ E+19$ atoms/cm$^3$.

10. The method of claim 1, wherein a first gas comprising $GeH_4$ or $Ge_2H_6$, having a partial pressure of between about 0.05 Pa and about 3 Pa, is used in forming the in-situ doped $Si_{1-x}Ge_x$ source/drain regions.

11. The method of claim 1, wherein a second gas, including $PH_3$, has a partial pressure of between about 0.005 Pa and about 0.5 Pa used in forming the in-situ doped $Si_{1-x}Ge_x$ source/drain regions.

12. A method of making an N-type field effect transistor (N-FET), the method comprising:
    providing a substrate with a Ge channel region;
    forming a gate dielectric over the Ge channel region;
    forming a gate electrode over the gate dielectric;
    disposing sacrificial gate spacers on the gate electrode and the gate dielectric;
    etching cavities into the substrate, wherein the cavities extend under the sacrificial gate spacers; and
    forming in the cavities in-situ doped $Si_{1-x}Ge_x$ source/drain regions that are lattice mismatched to the channel region, wherein $x<0.85$.

13. The method of claim 12, wherein x is between about 0.15 and about 0.85.

14. The method of claim 12 further comprising decreasing x during the forming of the in-situ doped $Si_{1-x}Ge_x$ source/drain regions, thereby forming graded Ge source/drain regions.

15. The method of claim 12, wherein x is substantially consistent throughout the forming of the in-situ doped $Si_{1-x}Ge_x$ source/drain regions.

16. The method of claim 12, wherein the in-situ doped $Si_{1-x}Ge_x$ source/drain regions are doped with a dopant selected from the group consisting essentially of phosphorous, arsenic, antimony, and combinations thereof.

17. The method of claim 12, wherein the in-situ doped $Si_{1-x}Ge_x$ source/drain regions further comprise carbon.

18. The method of claim 12 further comprising forming a Ge silicide on the in-situ doped $Si_{1-x}Ge_x$ source/drain regions, the gate electrode, or both the in-situ doped $Si_{1-x}Ge_x$ source/drain regions and the gate electrode.

* * * * *